(12) United States Patent  (10) Patent No.: US 7,823,795 B2
Finkler  (45) Date of Patent: Nov. 2, 2010

(54) PATTERN BASED ELABORATION OF HIERARCHICAL L3GO DESIGNS

(75) Inventor: Ulrich A. Finkler, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 883 days.

(21) Appl. No.: 11/695,245

(22) Filed: Apr. 2, 2007

(65) Prior Publication Data

US 2008/0244493 A1 Oct. 2, 2008

(51) Int. Cl.
G06K 19/06 (2006.01)

(52) U.S. Cl. .................. 235/494; 235/375

(58) Field of Classification Search ........... 235/494, 235/375; 345/472; 707/999.05, 999
See application file for complete search history.

(56) References Cited

U.S. PATENT DOCUMENTS 5,539,841 A * 7/1996 Huttenlocher et al. ....... 382/218
7,603,351 B2 * 10/2009 Mansfield et al. ............ 1/1
2006/0043203 A1 * 3/2006 Floriach et al. ............ 235/494
2006/0237546 A1 * 10/2006 Lapstun et al. ............ 235/494
2007/0250497 A1 * 10/2007 Mansfield et al. .......... 707/5
2007/0262993 A1 * 11/2007 Fux et al. ................. 345/472
2008/0037070 A1 * 2/2008 Chen ...................... 358/3.26
2008/0218522 A1 * 9/2008 Fux et al. ................. 345/472
2009/0327285 A1 * 12/2009 Mansfield et al. .......... 707/5

* cited by examiner

*Primary Examiner*—Thien M Le
(74) *Attorney, Agent, or Firm*—Brian Verminski; Hoffman Warnick LLC

(57) ABSTRACT

A system, method and program product that utilizes flat pattern based L3GO elaboration in a hierarchical environment to create a nested conventional layout. A system is provide for processing a glyph layout to generate shapes for use in a VLSI (very large scale integrated circuit) design process, including: a hierarchical pattern search system that matches patterns from a pattern library to a set of glyph data, wherein the patterns have dependencies that cross hierarchical design boundaries; and a target shape generation system that selects patterns from a set of matching patterns and generates associated shapes.

14 Claims, 5 Drawing Sheets

PATTERN BASED ELABORATION OF HIERARCHICAL L3GO DESIGNS

FIELD OF THE INVENTION

The invention generally relates to processing L3GO VLSI designs, and more specifically relates to a system and method of providing pattern based elaboration of hierarchical L3GO layouts.

BACKGROUND OF THE INVENTION

L3GO (Layout using Gridded Glyph Geometry Objects) is an ongoing project for improving the manufacturability of VLSI designs. L3GO provides a restricted set of objects or patterns that describes circuit connectivity and devices, referred to as glyphs. L3GO has three types of glyphs, including:

1. Stick glyphs, which are 1-dimensional line segments drawn between two grid points, e.g., used to describe FET gates or for interconnections. The attached properties of a stick glyph include which layer the stick belongs to, the start and end point, and a target width;

2. Contact glyphs, which are 0-dimensional points lying at grid points, e.g., used to describe vertical interconnections (contacts and vias). The attached properties of a contact glyph include which layer the contact belongs to, and parameters that specify how contacts are to be arranged in a matrix, e.g. the number of rows and columns in the matrix, the size of each contact, the horizontal and vertical distances between columns and rows, respectively and an optional offset of the matrix center relative to the glyph position; and 3. Area glyphs, which are 2-dimensional, axis aligned rectangles whose vertices are on grid points, e.g., used to describe diffusion regions. In addition to their specific attributes, glyphs can carry 'design intent' attributes, e.g. net names, ratings of their importance etc. A process called elaboration turns sets of glyphs into geometry (pre-data-prep mask shapes).

A pattern describes a glyph configuration, e.g., a contact glyph with certain properties sitting on a stick glyph with another set of properties. Elaboration creates shapes for this configuration based on a set of parameters, e.g., elaboration may create a pad on an M1 stick and four redundant vias on the pad. Given the computational complexity of converting glyph patterns into VLSI designs, the identification of pre-defined patterns is a key component of the elaboration process. Various aspects of elaboration are described in U.S. patent application PSEUDO-STRING BASED PATTERN RECOGNITION IN L3GO DESIGNS, Ser. No. 11/621,383, filed on Jan. 9, 2007, and U.S. patent application GRAPH-BASED PATTERN MATCHING IN L3GO DESIGNS, Ser. No. 11/623,541, filed on Jan. 16, 2007, (collectively referred to as "L3GO disclosures"), which are hereby incorporated by reference. In particular, these disclosures describe a process for matching patterns at a single or discrete hierarchical level.

One of the challenges of the elaboration process involves the fact that glyph patterns are essentially specified in a flat (i.e., two-dimensional) space, but L3GO designs and the produced VLSI designs are in the majority of cases described hierarchically. The major reason for using a hierarchical description is to hide the vast amount of detail in a design. By reducing the distracting detail to a single object that is lower in the hierarchy, one can greatly simplify many CAD (computer aided design) operations. For example, simulation, verification, design-rule checking, and layout constraints can all benefit from hierarchical representation, which makes them much more computationally tractable.

Since many circuits are too complicated to be easily considered in their totality, a complete design is often viewed as a collection of component aggregates that are further divided into subaggregates in a recursive and hierarchical manner. In VLSI design, these aggregates are commonly referred to as cells. The use of a cell at some point in a circuit implies that the entire content of the cell's definition is present at that point in the final circuit. Multiple uses of a cell indicate that the cell contents are to be repeated at each use. Graphically, an instance can be seen as an outline that displays only the boundary of the cell definition, or it can be displayed more fully by showing the cell's contents.

Accordingly, a need exists for a system and method that can apply flat pattern based L3GO elaboration in a hierarchical environment to create a nested conventional layout.

SUMMARY OF THE INVENTION

The present invention addresses the above-mentioned problems, as well as others, by providing a system, method and program product that utilizes flat pattern based L3GO elaboration in a hierarchical environment to create a hierarchical conventional layout.

In a first aspect, the invention provides a system for processing a glyph layout to generate shapes for use in a VLSI (very large scale integrated circuit) design process, comprising: a hierarchical pattern search system that matches patterns from a pattern library to a set of glyph data, wherein the patterns have dependencies that cross hierarchical design boundaries; and a target shape generation system that selects patterns from a set of matching patterns and generates associated shapes.

In a second aspect, the invention provides a computer program product stored on a computer readable medium for processing a glyph layout to generate shapes for use in a VLSI (very large scale integrated circuit) design, comprising: program code configured for matching patterns from a pattern library to a set of glyph data, wherein the patterns have dependencies that cross hierarchical design boundaries; and program code configured for selecting patterns from a set of matching patterns and generating associated shapes.

In a third aspect, the invention provides a method for processing glyph-based data, comprising: for each scope, determine an amount of context information necessary to ensure a correct result for a pattern search; perform a flat pattern matching for the scope and its associated context, and determined associated output regions; for each scope and its associated output regions, determine how much context is necessary to ensure correct results for conflict resolution; perform conflict resolution for each scope; and generate a set of valid pattern placements for a plurality of hierarchical levels.

BRIEF DESCRIPTION OF THE DRAWINGS

These and other features of this invention will be more readily understood from the following detailed description of the various aspects of the invention taken in conjunction with the accompanying drawings in which.

DETAILED DESCRIPTION OF THE INVENTION

Figure 1:
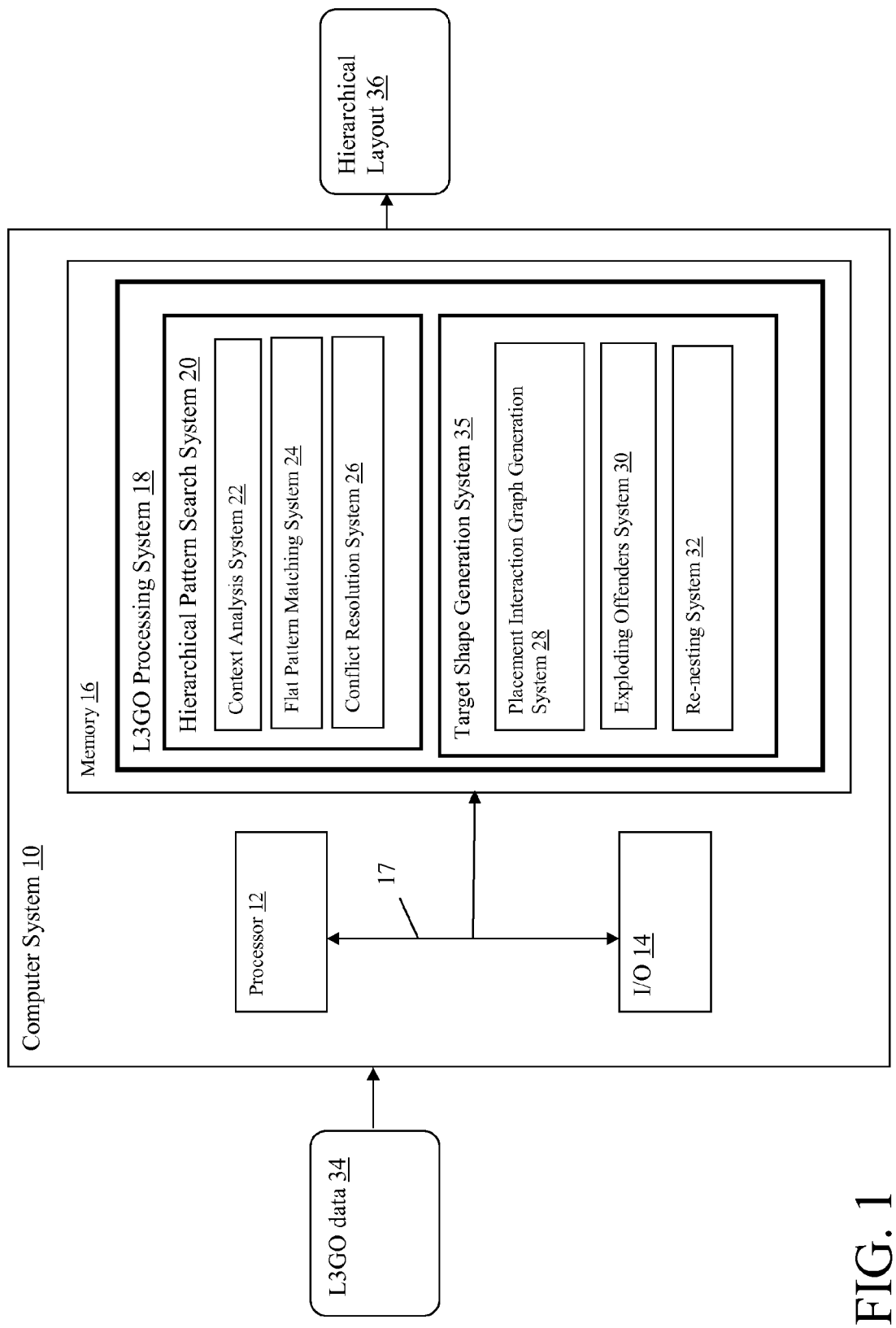
FIG. 1 depicts a computer system having an L3GO processing system in accordance with an embodiment of the present invention.

Referring now to drawings, FIG. 1 depicts a computer system 10 having an L3GO processing system 18 for processing L3GO data 34 and generating a hierarchal layout 36. Inputted L3GO data 34 include glyph patterns (e.g., stick glyphs, contact glyphs, and area glyphs) and outputted hierarchical layout 36 includes output regions and associated target shapes arranged in different hierarchical levels. L3GO processing system 18 includes: (1) a hierarchical pattern search system 20 that searches the L3GO data 34 and identifies a set of successful matches, referred to as valid pattern placements; and (2) a target shape generation system 35 that generates an output region and associated shapes for each pattern placement.

Hierarchical pattern search system 20 utilizes a hierarchical contact graph (described below) to locate patterns that correspond to the L3GO data 34. Hierarchical pattern search system 20 includes: a context analysis system 22 that identifies context, i.e., parts of possible pattern placements from lower hierarchical levels; a flat pattern matching system 24 that performs flat pattern matching at discrete hierarchical levels for each cell and its context; and a conflict resolution system 26 that resolves conflicts, i.e., overlaps among output regions.

Target shape generation system 35 includes a placement interaction graph generation system 28 to be used to compute effective output regions and shapes for each cell; an exploding offenders system 30 that moves offending shapes to empty regions in a higher hierarchical level; and a re-nesting system 32 that removes redundant point sets.

These various features are described in further detail below. Note that while the illustrative embodiments are described with reference to an L3GO-based system, the invention could be applied to any now known or later developed glyph-based system for generating VLSI or other types of designs. Note also that while L3GO processing system 18 is shown as a stand-alone process, part of all it could be integrated into an elaboration system or process.

L3GO elaboration in a flat environment takes a configuration of glyphs and an elaboration rule set and produces conventional geometry (i.e., pre data-prep mask shapes) based on the rule set. A flat pattern search mechanism is utilized to locate patterns that correspond to the L3GO layout. The rule set consists of groups of patterns. Groups have priorities and the output of higher priority groups overwrites lower priority groups. The patterns within a group also have priorities. Each pattern has a region for which it claims responsibility, called its output region. If the output regions of two pattern placements (i.e., locations in the L3GO layout where the patterns match) overlap, this creates a conflict since the result is ambiguous in the overlap region. In case of a conflict within a group, the pattern with higher priority prohibits the placement of any conflicting pattern with lower priority.

In the elaboration process there are several mechanisms that produce "dependency chains" whose extent can only be determined after the chain has been established and selected. A dependency chain is essentially a set of components, e.g., cells, lines, contacts, etc., whose specific implementation depend upon each other. Dependencies may occur any time the implementation or characteristics of one component affects the implementation of another, e.g., a pattern may modify a connection on one end of a long line depending on how the line is contacted on the other end. Dependency chains may involve many components and may span different hierarchical levels, e.g., a line may need to be moved to the side since another line is too close, which requires the contacts on the moved line to be moved, and further requires that the metal on the next layer is adjusted to modify the coverage of the moved contacts, etc.

Figure 2:
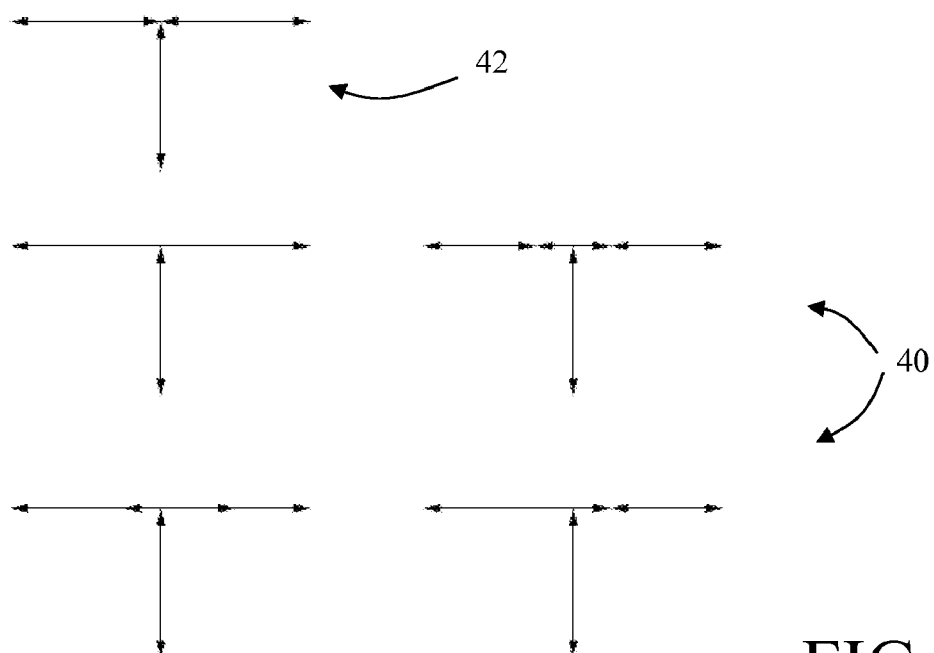
FIG. 2 depicts an example of how sticks are normalized in accordance with an embodiment of the present invention.

These types of dependency chains occur for the following reasons:

(1) The glyph representation has to be normalized. An example of normalization is shown in FIG. 2 in which the four sets of sticks 40 at the bottom are normalized to a normalized form 42 at the top. Since glyph pieces interact across hierarchy boundaries, normalization can span over multiple levels of hierarchy and large distances.

Figure 3:
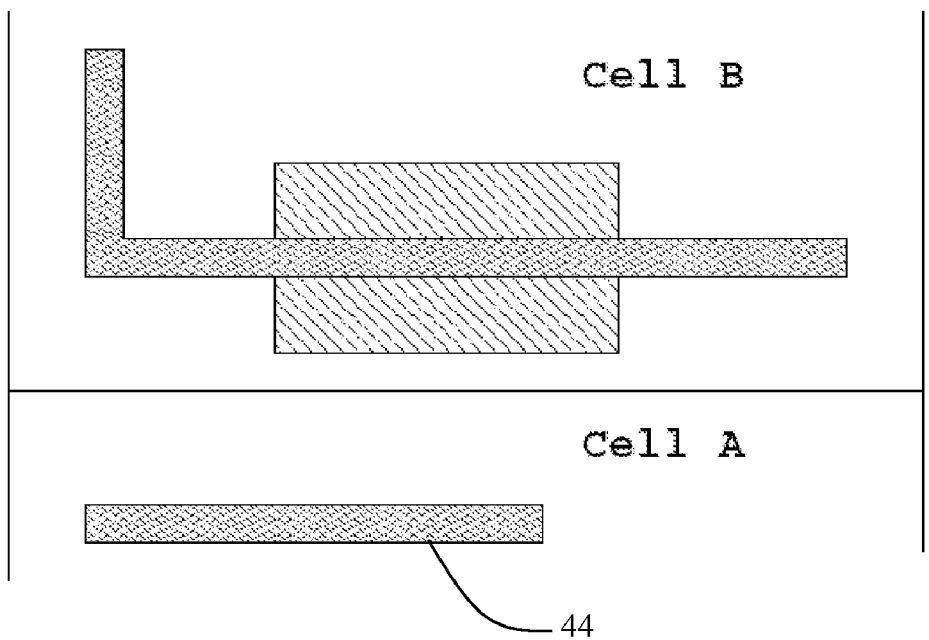
FIG. 3 depicts an example of a cross hierarchy pattern in accordance with an embodiment of the present invention.

(2) Patterns are graph based and form graphs of arbitrary diameter that cross multiple cell boundaries. For example, FIG. 3 depicts two cells (Cell A and Cell B). Extending the poly line 44 in Cell A will have an impact on Cell B, i.e., it will improve performance.

(3) Successful pattern matches, i.e., placements, interact in the form of conflicts. The conflicts form a graph between placements whose edges cross hierarchy boundaries. An example of this is described below with regard to FIG. 8.

Because patterns often need to cross hierarchical boundaries and, e.g., the size of a pattern placement is in general unpredictable, unique challenges exist in generating valid pattern placements. Accordingly, a methodology is herein provided to process L3GO data 34 to produce hierarchical sets of valid patterns in the generated cells. The methodology can be broken down into the following steps.

(1) For each flat processing scope, e.g., a cell or geometric tiles in a cell, determine the amount of context information (i.e., L3GO glyphs from lower in the hierarchy) necessary to ensure correct results for the pattern search;

(2) Perform flat pattern matching for the scope and its context;

(3) For each flat scope and its output regions, determine how much context is necessary to ensure correct results for conflict resolution (i.e. pattern placements lower in the hierarchy that are connected to placements in the current cell through conflict paths);

(4) Perform conflict resolution in each scope for each group; and (5) Generate hierarchical results based on the actions.

Hierarchical Pattern Searching System

Hierarchical pattern search system 20 essentially provides a mechanism for finding patterns (e.g., from a pattern library such as a dictionary or database) that correspond to glyph structures in the LG30 design data 34. Hierarchical pattern searching must not only take into account the scope, but also the context. The computation of context for a pattern search, which is performed by context analysis system 22, is similar to the process used for a traditional net build. For each layer pair relevant for the pattern deck there is a maximal distance s at which interactions may form relations.

Designs consist out of shapes on different layers, almost 3-dimensional in nature. Patterns contain relationships, e.g., a stick glyph on layer M1 and a parallel stick glyph on layer M2 that are closer than X nanometers to each other. From all the relationships in a pattern, the largest interaction distance that is used between two items, e.g., M1 and M2 glyphs, can be determined. The contact graph has to contain all relations between such items (e.g., M1 and M2 glyphs) that are smaller or equal than that distance in order to ensure that all possible pattern matches are found.

The first step in the hierarchical pattern search is the computation of a hierarchical contact graph. A scope P in a hierarchical contact graph is an undirected graph whose nodes either represent a glyph (leaf nodes) or an instance of another scope (internal nodes). Edges in a scope P can connect two leafs, a leaf and an internal node or two internal nodes. For each adjacency of an edge with an internal node n there is a connection to a leaf node in the scope C that is instantiated by n. The scopes in the hierarchical contact graph correspond to the cells in the VLSI layout, i.e., the hierarchical contact graph is equivalent to a flat undirected contact graph analogous to the way a hierarchical VLSI design is equivalent to a set of flat semiconductor manufacturing masks.

Figure 4:
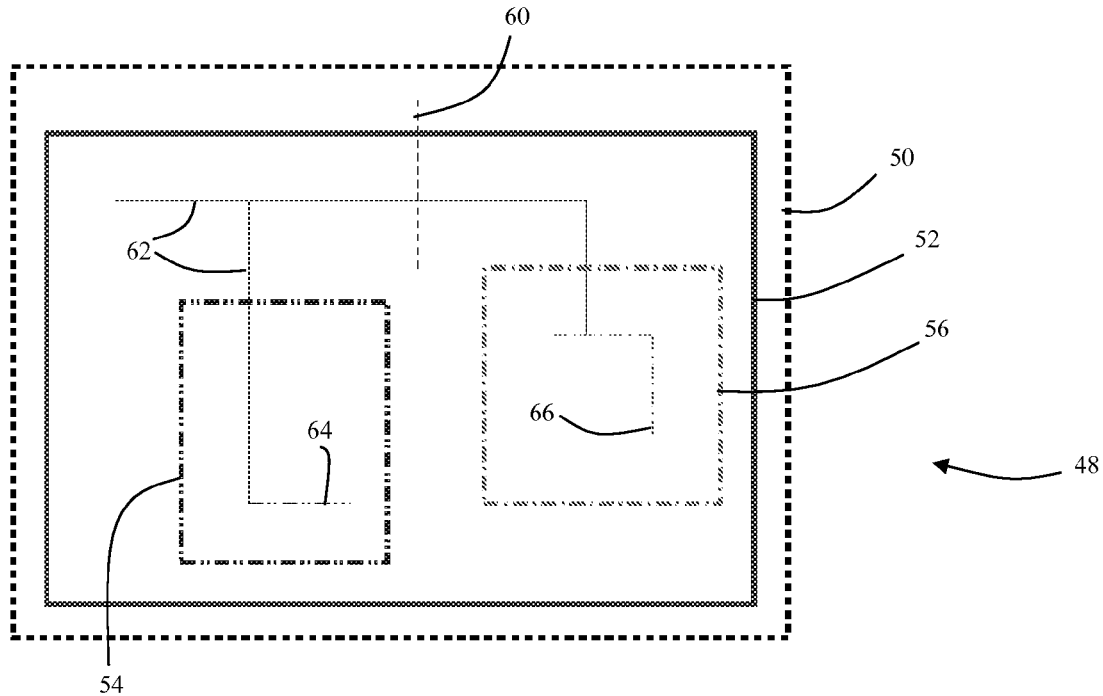
FIG. 4 depicts an example of a hierarchical glyph layout in accordance with an embodiment of the present invention.
Figure 5:
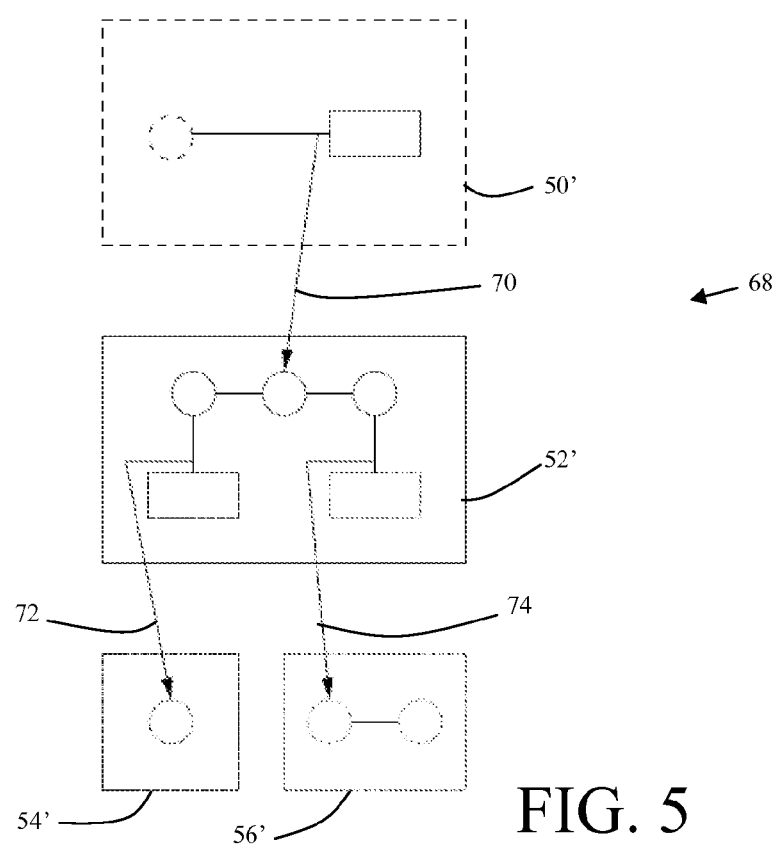
FIG. 5 depicts a hierarchical contact graph corresponding to the layout of FIG. 4.

FIG. 4 depicts an example of a simplified hierarchical glyph layout 48. The rectangles 50, 52, 54, 56 represent cell boundaries, while the lines 60, 62, 64, 66 represent associated stick glyphs that belong to respective cells, i.e., line 60 belongs to cell 50, lines 62 belong to cell 52, line 64 belongs to cell 54 and line 66 belongs to cell 56. FIG. 5 depicts the hierarchical contact graph 68 that corresponds to the layout 48 of FIG. 4. Hierarchical contact graph 68 includes scopes or nodes 50', 52', 54' and 56' that correspond to cells 50, 52, 54 and 56, respectively. Connections (i.e., edges) 70, 72 and 74 connect the hierarchically arranged nodes.

For each cell C in the layout 48 (and thus each scope in the hierarchical contact graph 68), a flat sub-problem is constructed by following the connectivity in the hierarchical contact graph 68. The context of a given cell P consists of subnets lower in the hierarchy whose members are connected to members of P based on the hierarchical contact graph 68.

The pattern search in the constructed sub-problem is performed with a flat backtracking mechanism (see, e.g., L3GO disclosures noted above), but the test for the content of the input regions is different. The connectivity specification used to construct the flat sub-problem does not necessarily cover all glyphs that interact with input regions. Furthermore, the size of input regions cannot be pre-computed since it depends on the actual match. Thus, testing the input region constraints is performed through a hierarchical two-dimensional search structure.

Hierarchical Conflicts

Once all the potential pattern placements for all cells are determined, a valid subset of placements has to be determined for each pattern group in each cell by conflict resolution system 26 (FIG. 1). The conflicts, i.e. overlaps between output regions, are not known before this point since the output regions depend on the parameters determined through the individual pattern placements. Furthermore, there may be cross-hierarchy conflicts that create conflict dependency chains that span across several cells. Note that the presence of a high priority placement in a descendent cell may prohibit placements in a parent cell. A hierarchical conflict graph is thus constructed analogous to the hierarchical contact graph described above.

Since the search step had imported connected components in the hierarchical contact graph, a placement P1 in a descendent C of P falls into one of two categories:

(1) The stick and point elements of pattern placements found in P cover the elements of P1; or
(2) The stick and point elements of P1 are disjoint from all stick and point elements of pattern placements found in P.

Not all pattern placements in a descendent cell C are still matches when 'pulled up' to an ancestor P. An ancestor cell on the path from C to P (including P) may add context that invalidates a match in a descendent cell, e.g., if there is an input violation for a placement P1 in the context added by an ancestor while traveling up in the hierarchy.

In order to resolve conflicts as described in the L3GO disclosures noted above in a hierarchical environment and to create a geometrical correct solution, more than the conflict interactions have to be taken into account. The construction of context for conflict resolution based on the hierarchical conflict graph and target shape generation is described below.

Target Shape Generation

Target shape generation system 35 (FIG. 1) applies all the actions for a given set of valid placements to generate an output region and shapes on a target layer (i.e., a discrete hierarchical level) for each placement. The output regions and thus the target layer shapes produced by the placements within a group do not overlap and can thus be unioned together in a flat environment. The combination of the geometry created by all the groups in a pattern set in a flat environment is done as follows:

(1) Initialize the result point set R to be empty; and
(2) Sort the rules ascendingly by priority and process one group G at a time in that order as follows:
   (a) Subtract the output regions of the current group G from R; and
   (b) Union the result point-set produced by G to R.

Figure 6:
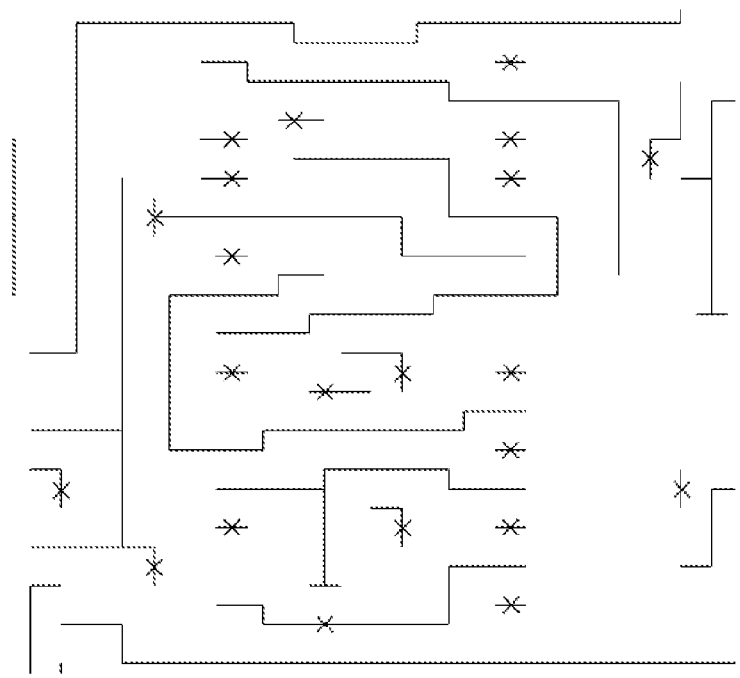
FIG. 6 depicts a glyph layout having a restricted rule design in accordance with an embodiment of the present invention.
Figure 7:
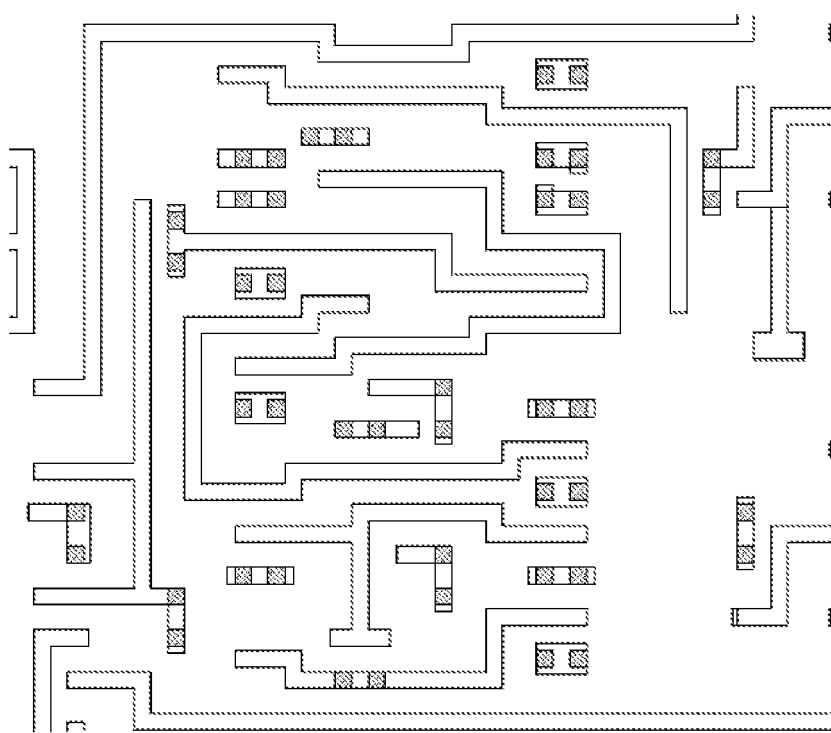
FIG. 7 depicts target shapes for the restricted design example of FIG. 6.

The result R of this process is the combination of geometry specified by the actions of the valid set of pattern placements. If the pattern set is additive or subtractive, the final result is obtained through a union or difference of R with the specified base layer, respectively. FIG. 7 shows an illustrative set of resulting target shapes for the restricted design example in FIG. 6. FIG. 6 includes one metal layer and one contact layer, with the contact glyphs being shown as X's.

If the pattern search was performed hierarchically, then each scope S (i.e., cell or tile) contains a valid set of pattern placements that cover the patterns in the content and the context that was imported for the pattern search in S. Due to the pulling of context, the geometry created in a cell S may contain much more un-nested content than necessary for the representation of the result. Furthermore, the geometry in a descendent cell C may contain result shapes that are incorrect in some of C's instantiations. The target shape generation system 35 (FIG. 1) has to adjust the results accordingly.

Consider the flattened content of a hierarchy rooted in a cell P. P will contain a set of placement instances, each of which is characterized by an instance path Ik in the hierarchy. Each such instance path starts in P and ends with a placement in a descendant cell C. Accumulating the coordinate transforms along the instance path provides the coordinate transform that brings the elements, input and output regions of the placement at the end of the path into the coordinate system of P. There are three types of relationships between two such placement instances Ik and Ij when brought into the coordinate system of P:

(1) Their output regions overlap, i.e., they are in conflict.

(2) Elements in Ik cause input region violations in Ij or vice versa.

(3) There are elements Qk in Ik and Qj in Ij such that Qk and Qj are on the same normalized glyph in P or they are on two normalized glyphs between which a path exists in the flat contact graph (as described above).

The placement interaction graph ⌈ has flattened placement instances Ik as nodes and two nodes are connected by an edge if at least one of the three types of relationships mentioned above exists between the corresponding placement instances. ⌈ can be partitioned into connected components. A nested connected component in ⌈ is a connected component in which all nodes have instance paths with a length larger than one. The effective output region (P) of a cell P is the least enclosing rectangle (LER) of the output regions in the placement interaction graph of P without the output regions of nested connected components. The effective result for a cell P is the shapes produced by the actions of the placements that contribute to the effective output region.

Figure 8:
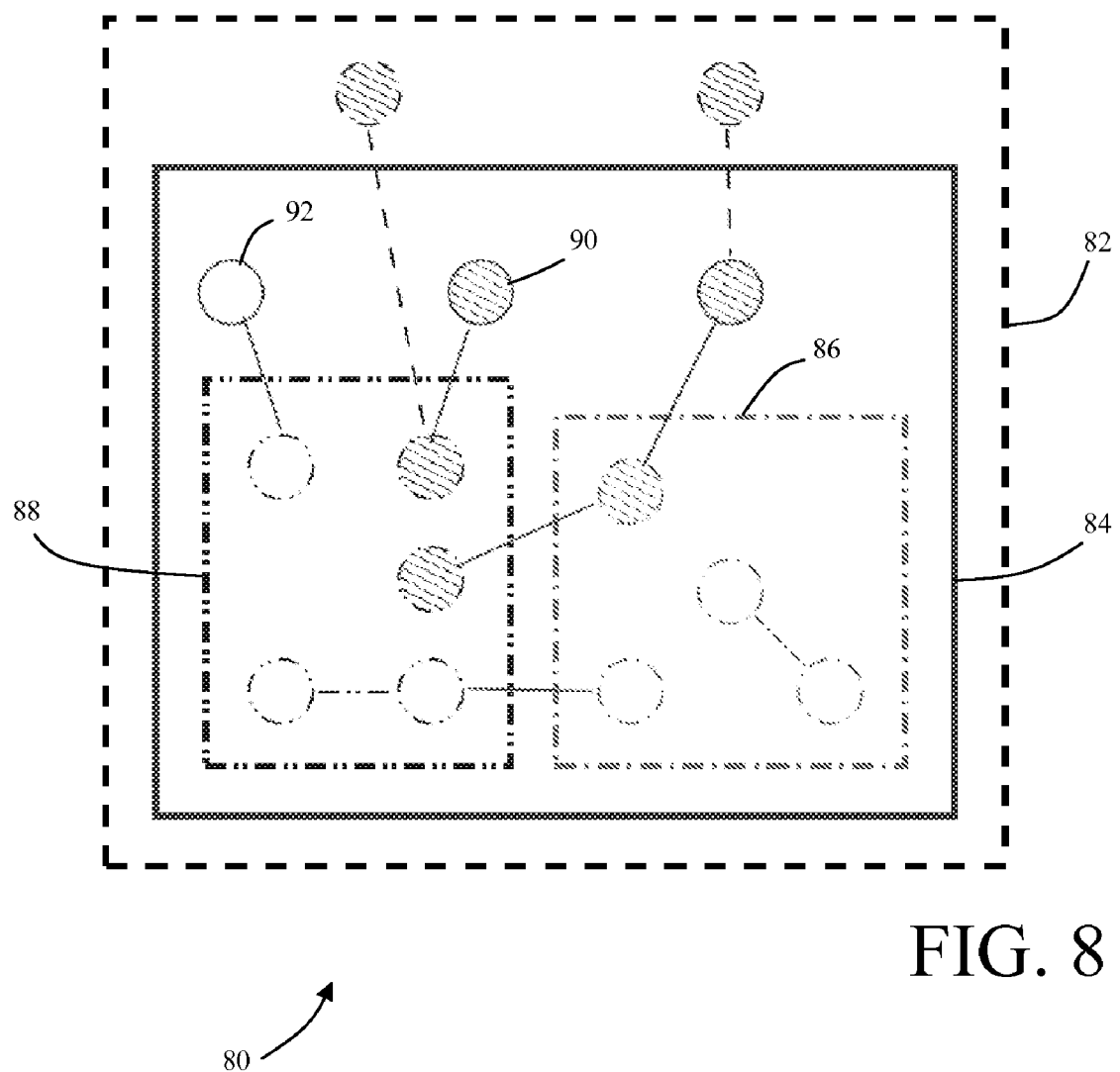
FIG. 8 depicts a visualization of a placement interactive graph in accordance with an embodiment of the present invention.

Note that there is a hierarchical version of the placement interaction graph analogous to the relationship between a hierarchical and a flat contact graph. FIG. 8 shows a visualization of a hierarchical placement interaction graph 80 and its flat counterpart (when the three interior rectangles indicating cell instantiations are ignored). In the hierarchical placement interaction graph 80, rectangles 82, 84, 86, 88 represent cell outlines, and the circles (e.g., 90, 92) represent placements. Connected components with shaded placements are not nested and contribute to the effective output region and result of the top level cell 82. Note that the line styles of the placement edges indicate the cell in which the corresponding interactions "live."

Generating a correct nested result requires the following steps:

(1) Build the hierarchical placement interaction graph. For efficiency reasons redundant edges are omitted.

(2) Compute the effective output region and effective result for each cell.

(3) Explode 'offending shapes', i.e., shapes in a cell C's result that are covered by empty effective output region in one of its ancestors.

(4) Re-nesting geometry, i.e., removing content in a cell P that is already covered by the 'non-offending' result in a descendent C.

Exploding Offenders

Exploding offenders system 30 (FIG. 1) addresses offending shapes in a cell C lower in the hierarchy by finding shapes in C that are not present in the flat design for some instantiations of C. These shapes are moved into the direct parents where they are covered by an empty output region and thus erased, covered by a result and absorbed, or not covered by the output region in the parent and thus are added. The process is recursively repeated with the ancestor cells, so that the offending shapes 'bubble' up in the hierarchy. Explosion of offenders is performed as follows:

(1) From leaf to root the least enclosing rectangle (or another cover shape) of the output regions is computed for each cell. The covers of children contribute to the cover of the parent cell.

(2) From root to leaf, compute area that is declared 'empty' by at least one parent, each cell is associated with a point set that collects contributions to its 'empty region', called the total empty region. It is initially empty for all cells.

(a) Compute the difference between the union of the output regions and the union of the results in cell C, this is the native empty region.

(b) Union the native empty region with the total empty region which contains at this point all contributions from parent cells.

(c) For each instance, intersect the total empty region with the shadow of the child, transform the result into the coordinate space of the child and add it to the child's total empty region.

(3) From leaf to root, move up 'offending shapes'. A point set Offenders is associated with each cell that is initially empty.

(a) For all children of the current cell P, transform their Offenders into the coordinate system of P and union them into the result RP of P.

(b) Store the intersection of RP with the total empty region of P into the Offenders of P.

(c) Subtract the total empty region of P from RP. I.e., only shapes that are not covered by an empty output region in a parent are kept for the result of P.

Note that the number of steps in the process is proportional to the number of instances in the design. A child cell does not determine its offenders on a 'per instance' basis, but accumulated for all instances in a single Boolean point set operation.

In the worst case, the number of vertices in point sets that are processed is proportional to the size of the flat design and this is required to achieve a correct result. In practice the offending shapes are filtered within a few generations since they are covered by empty output regions in ancestors and the complexity is dominated by the size of the nested design.

Removing Redundant Point Sets

In an additional process, redundant point sets can be removed in ancestors if they are already covered in a descendant by re-nesting system 32 (FIG. 1). This produces a more nested result, which is beneficial for further processing. During this 're-nesting' process certain restrictions apply to satisfy methodology requirements. For example, if it is required that all components of a device reside in the same cell, then the redundancy removal does not remove diffusion shapes and gate shapes that are covered by corresponding area glyphs in the input.

The process of re-nesting is similar to the explosion of the offenders.

(1) The computed LERs from the explosion of the offenders can be reused.

(2) From root to leaf, compute area that is declared as 'covered by result' by at least one parent, each cell is associated with a point set that collects contributions to its 'covered in parent region', called the total cover region. It is initially empty for all cells.

(a) Union the native result with the total cover region which contains at this point all contributions from parent cells.

(b) For each instance, intersect the total cover region with the shadow of the child, transform the result into the coordinate space of the child and add it to the child's total cover region.

(3) From leaf to root, move up 'non-offending' results that may be covered by a parent. A point set "Eraser" is associated with each cell that is initially empty.

(a) For all children of the current cell P, transform their Erasers into the coordinate system of P and union them into P's Eraser.

(b) Subtract P's Eraser from the native result in P.

(c) Union the remaining result in P with P's Eraser.

Note again that the number of point set operations that is performed is proportional to the number of instances in the design. The number of vertices is in the worst case again proportional to the size of the flat design. In this case the context 'pulling' for pattern search and conflict resolution had to bring up an amount of context that is proportional to the flat size of the cell in a sufficiently large number of cells. If it was possible to perform the pattern matching and conflict resolution highly nested, the total cover regions and the Erasers will contain very few vertices.

Finally, attributes have to be transferred from the glyphs to the target shapes. This can either be done through an explicit association of elements with target shapes in the pattern (transfer attributes A, B, C from glyph α to shape β in the result statement) or through position, if methodology rules allow to deduct a common point between the created target shape and the original glyph.

In general, computer system 10 (FIG. 1) may comprise any type of computer system and could be implemented as part of a client and/or a server. Computer system 10 generally includes a processor 12, input/output (I/O) 14, memory 16, and bus 17. The processor 12 may comprise a single processing unit, or be distributed across one or more processing units in one or more locations, e.g., on a client and server. Memory 16 may comprise any known type of data storage and/or transmission media, including magnetic media, optical media, random access memory (RAM), read-only memory (ROM), a data cache, a data object, etc. Moreover, memory 16 may reside at a single physical location, comprising one or more types of data storage, or be distributed across a plurality of physical systems in various forms.

I/O 14 may comprise any system for exchanging information to/from an external resource. External devices/resources may comprise any known type of external device, including a monitor/display, speakers, storage, another computer system, a hand-held device, keyboard, mouse, voice recognition system, speech output system, printer, facsimile, pager, etc. Bus 17 provides a communication link between each of the components in the computer system 10 and likewise may comprise any known type of transmission link, including electrical, optical, wireless, etc. Although not shown, additional components, such as cache memory, communication systems, system software, etc., may be incorporated into computer system 10.

Access to computer system 10 may be provided over a network such as the Internet, a local area network (LAN), a wide area network (WAN), a virtual private network (VPN), etc. Communication could occur via a direct hardwired connection (e.g., serial port), or via an addressable connection that may utilize any combination of wireline and/or wireless transmission methods. Moreover, conventional network connectivity, such as Token Ring, Ethernet, WiFi or other conventional communications standards could be used. Still yet, connectivity could be provided by conventional TCP/IP sockets-based protocol. In this instance, an Internet service provider could be used to establish interconnectivity. Further, as indicated above, communication could occur in a client-server or server-server environment.

It should be appreciated that the teachings of the present invention could be offered as a business method on a subscription or fee basis. For example, a computer system 10 comprising an L3GO processing system 18 could be created, maintained and/or deployed by a service provider that offers the functions described herein for customers. That is, a service provider could offer to provide hierarchical glyph processing as described above.

It is understood that the systems, functions, mechanisms, methods, engines and modules described herein can be implemented in hardware, software, or a combination of hardware and software. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. In a further embodiment, part or all of the invention could be implemented in a distributed manner, e.g., over a network such as the Internet.

The present invention can also be embedded in a computer program product, which comprises all the features enabling the implementation of the methods and functions described herein, and which—when loaded in a computer system—is able to carry out these methods and functions. Terms such as computer program, software program, program, program product, software, etc., in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

The invention claimed is:

1. A system for processing a glyph layout to generate shapes for use in a VLSI (very large scale integrated circuit) design process, comprising:
   at least one computer device, including:
      a hierarchical pattern search system that matches patterns from a pattern library to a set of glyph data, wherein the patterns have dependencies that cross hierarchical design boundaries; and
      a target shape generation system that selects patterns from a set of matching patterns and generates associated shapes;
      wherein the target shape generation system includes at least one of a system for generating a placement interaction graph, a system for exploding offenders, or a re-nesting system.

2. The system of claim 1, wherein the glyph layout comprises L3GO (Layout using Gridded Glyph Geometry Objects) design data.

3. The system of claim 1, wherein the hierarchical pattern search system includes a context analysis system that determines a set of possible pattern placements from a lower hierarchical level.

4. The system of claim 1, wherein the hierarchical pattern search system includes a flat pattern matching system that identifies glyph patterns at discrete hierarchical levels.

5. The system of claim 1, wherein the hierarchical pattern search system includes a conflict resolution system.

6. A computer program product stored on a computer readable storage medium for processing a glyph layout to generate shapes for use in a VLSI (very large scale integrated circuit) design when executed by a computer device, the computer program product comprising program code for:

matching patterns from a pattern library to a set of glyph data, wherein the patterns have dependencies that cross hierarchical design boundaries; and selecting patterns from a set of matching patterns and generating associated shapes;

wherein the selecting of patterns further comprises at least one of generating a placement interaction graph, exploding offenders, or re-nesting.

7. The computer program product of claim 6, wherein the glyph layout comprises L3GO (Layout using Gridded Glyph Geometry Objects) design data.

8. The computer program product of claim 6, wherein the matching of patterns determines a set of possible pattern placements from a lower hierarchical level.

9. The computer program product of claim 6, wherein the matching of patterns identifies glyph patterns at discrete hierarchical levels.

10. The computer program product of claim 6, wherein the matching of patterns includes resolving conflicts.

11. A method for processing glyph-based data, comprising:

for each scope, determine an amount of context information necessary to ensure a correct result for a pattern search;

perform a flat pattern matching for the scope and its associated context, and determined associated output regions;

for each scope and its associated output regions, determine how much context is necessary to ensure correct results for conflict resolution;

perform conflict resolution for each scope; and generate a set of valid pattern placements for a plurality of hierarchical levels.

12. The method of claim 11, wherein the scope comprises a cell or a tile within a cell.

13. The method of claim 11, wherein the associated context comprises a set of possible pattern placements from a lower hierarchical level.

14. The method of claim 11, further comprising generating target shapes for each of the valid pattern placements.

\* \* \* \* \*